United States Patent [19]
Taylor et al.

[11] Patent Number: 6,043,983
[45] Date of Patent: Mar. 28, 2000

[54] EMI CONTAINMENT FOR MICROPROCESSOR CORE MOUNTED ON A CARD USING SURFACE MOUNTED CLIPS

[75] Inventors: Scot W. Taylor, Apache Junction; Robert Starkston, Chandler; Charles Gealer, Phoenix; Michael L. Rutigliano, Chandler; Raymond A. Krick, Gilbert; John A. Rabenius, Tempe; Edmond L. Hart, Chandler; Ravi V. Mahajan, Tempe; Farukh Fares, Phoenix, all of Ariz.

[73] Assignee: Intel Corporation, Santa Clara, Calif.

[21] Appl. No.: 09/098,819

[22] Filed: Jun. 17, 1998

[51] Int. Cl.[7] ................................. H05K 7/20; H05K 9/00
[52] U.S. Cl. ....................... 361/704; 174/35 GC; 174/51; 361/715; 361/753; 361/816
[58] Field of Search ............................ 174/35 R, 35 GC, 174/51; 257/728; 361/704, 707, 715, 730, 737, 753, 799, 800, 816, 818

[56] References Cited

U.S. PATENT DOCUMENTS

| | | |
|---|---|---|
| 5,541,811 | 7/1996 | Henningsson et al. .................. 361/704 |
| 5,546,278 | 8/1996 | Bethurum ................................. 174/35 R |
| 5,615,085 | 3/1997 | Wakabayashi et al. .................. 361/687 |
| 5,659,459 | 8/1997 | Wakabayashi et al. .................... 174/51 |

*Primary Examiner*—Gregory Thompson
*Attorney, Agent, or Firm*—Blakely, Sokoloff, Taylor & Zafman LLP

[57] ABSTRACT

An electronic cartridge which includes a cover that is electrically coupled to a substrate by a clip. An integrated circuit package is mounted to the substrate and at least partially enclosed by the cover. The clips and cover may be connected to a ground plane of the substrate. The cover and substrate may create a "shield" about the integrated circuit package so that any electro-magnetic field that flows from the package is grounded to the substrate.

13 Claims, 1 Drawing Sheet

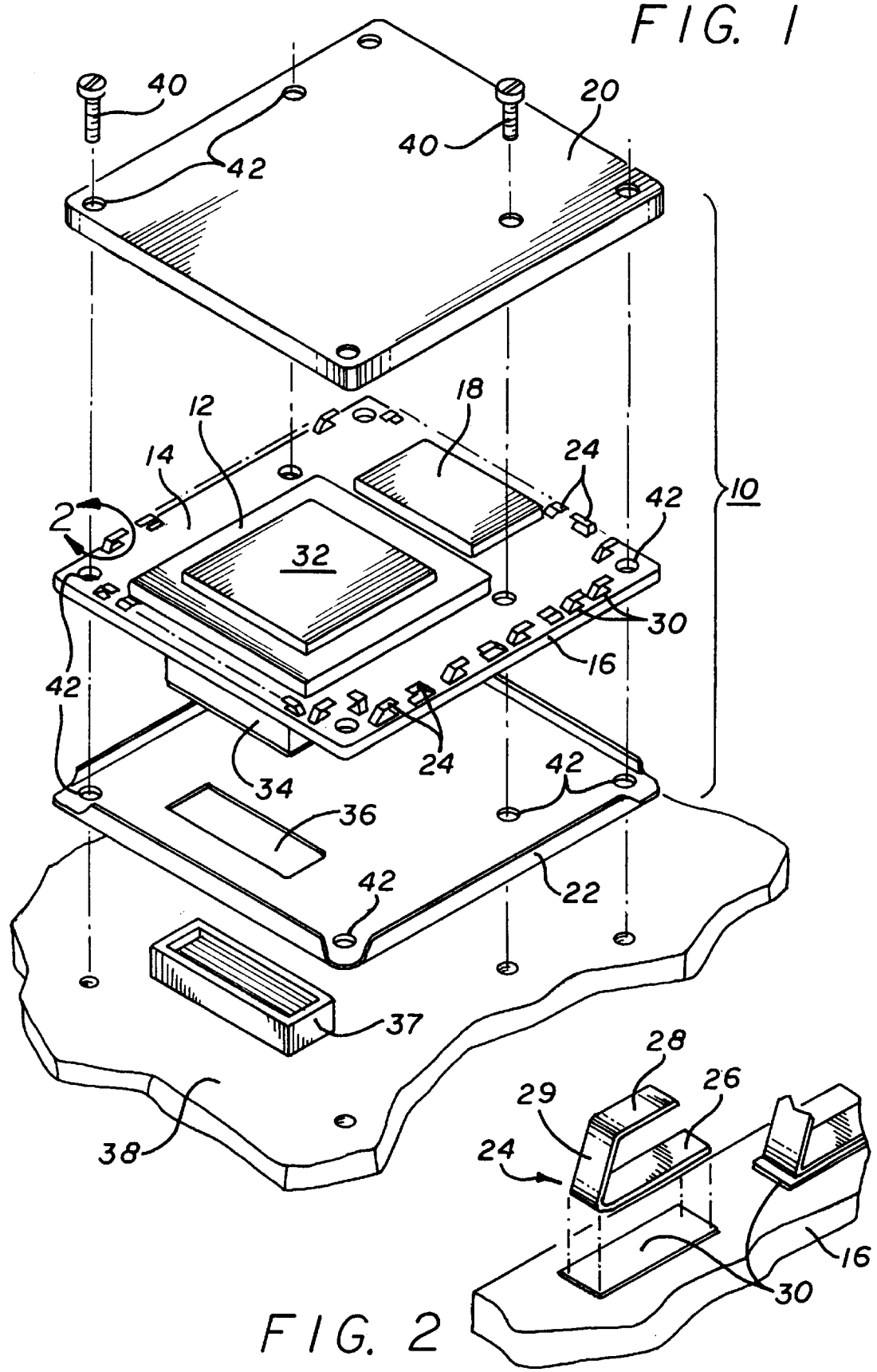

EMI CONTAINMENT FOR MICROPROCESSOR CORE MOUNTED ON A CARD USING SURFACE MOUNTED CLIPS

BACKGROUND OF THE INVENTION

1. Field of the Invention

The present invention relates to an electronic cartridge.

2. Background Information

Integrated circuits are typically assembled into packages that are soldered to a printed circuit board. The printed circuit board may be part of a system such as a computer. Each integrated circuit generates heat which must be removed from the package. Some electrical assemblies incorporate a thermal element that is coupled to the integrated circuit package and which provides a thermal path for the heat generated by the integrated circuit.

The integrated circuit may be a relatively high speed device such as a microprocessor. The high switching speeds of a microprocessor may create a relatively strong electromagnetic field that flows from the package. The electromagnetic field may become coupled to other devices within the electrical system. The electromagnetic coupling may create an unwanted interference in the other electrical circuits and degrade the operation of the system.

The thermal element that is coupled to the integrated Circuit package is typically constructed from a material such as copper or aluminum that is both thermally and electrically conductive. Unfortunately, an electrically conductive thermal element may function as an antenna for the electromagnetic field generated by the integrated circuit. It would be desirable to ground the thermal element to reduce the amount of electromagnetic interference within the system.

SUMMARY OF THE INVENTION

One embodiment of the present invention is an electronic cartridge which includes a cover that is electrically coupled to a substrate by a clip. An integrated circuit package is mounted to the substrate and at least partially enclosed by the cover.

BRIEF DESCRIPTION OF THE DRAWINGS

FIG. 1 is a perspective view of an embodiment of an electronic cartridge of the present invention;

FIG. 2 is a perspective view of a clip attached to a substrate of the cartridge.

DETAILED DESCRIPTION OF THE INVENTION

One embodiment of the present invention is an electronic cartridge which includes a cover that is electrically coupled to a substrate by a clip. An integrated circuit package is mounted to the substrate and at least partially enclosed by the cover. The clips and cover may be connected to a ground plane of the substrate. The cover and substrate may create a "shield" about the integrated circuit package so that any electromagnetic field that flows from the package is grounded to the substrate.

Referring to the drawings more particularly by reference numbers, FIG. 1 shows an embodiment of an electronic cartridge 10 of the present invention. The cartridge 10 may include a first integrated circuit package 12 that is mounted to a first side 14 of a substrate 16. The cartridge 10 may also include a second integrated circuit package 18 that is also mounted to the substrate 16. The substrate 16 may be a printed circuit board which has surface pads, routing traces, power/ground planes, vias, etc. as is known in the art.

The cartridge 10 may include a first cover 20 and a second cover 22 that enclose the first 12 and second 18 integrated circuit packages. The covers 20 and 22 are constructed from an electrically conductive material. By way of example, the covers 20 and 22 may be constructed from copper or aluminum.

The first cover 20 may be electrically coupled to the substrate 16 by a plurality of clips 24. The second cover 22 may be connected to the first cover 20 so that both covers 20 and 22 are electrically coupled to the substrate 16. The clips 24 and cover 20 may be coupled to a ground plane of the substrate 16.

The first integrated circuit package 12 may contain a high speed integrated circuit such as a microprocessor which generates an electromagnetic field. The cover(s) 20 and clips 24 may provide a return path for the electromagnetic field to the ground plane of the substrate 16. The cover(s) 20 and clips 24 can thus ground any electromagnetic interference (EMI) which flows from the package 12.

FIG. 2 shows an embodiment of a clip 24. The clip 24 may have a mount section 26 that is attached to the substrate 16 and a cantilevered beam section 28 which extends from a base section 29. The clip 24 is constructed from an electrically conductive material such as copper, aluminum or steel. The beam 28 and base 29 sections may be deflected when the cover 20 is coupled to the substrate 16. The base section 29 may be oriented at an oblique angle so that the clip 24 is deflected without buckling the base 29. The beam deflection creates a spring force that pushes the clip 24 into the cover 20. The spring force insures an electrical contact between the cover 20 and the clip 24.

The mount section 26 of each clip 24 may be attached to a corresponding surface pad 30 of the substrate 16. The surface pads 30 may be connected the ground plane of the substrate 16. The clips 24 may be soldered to the surface pads 30. Alternatively, the clips 24 may be attached to the surface pads 30 with an electrically conductive epoxy.

Referring to FIG. 1, the first integrated circuit package 12 may include a metal lid 32 that is thermally coupled to the first cover 20. The lid 32 may be connected to a ground plane of the integrated circuit package 12 so that the cover 20 is also electrically coupled to the package 12. The cartridge 10 may include a thermal grease or epoxy (not shown) that is located between the lid 32 and the cover 20. It may be desirable to fill the grease or epoxy with silver or another electrically conductive material to provide a conductive path between the lid 32 and the cover 20.

The cartridge 10 may include an electrical connector 34 that is mounted to a second side of the substrate 6. The second cover 22 may have an opening 36 which allows the connector 34 to be plugged into a corresponding connector 37 that is mounted to a printed circuit board 38. The cartridge 10 may also have a plurality of fasteners 40 which extend through corresponding clearance holes 42 in the substrate 16 and covers 20 and 22. The fasteners 40 can be screwed into the circuit board 38. The fasteners 40 can be attached to the circuit board 38 in a manner which applies a force that deflects the clips 24.

The cartridge 10 can be assembled by mounting the integrated circuit packages 12 and 18 to the substrate 16. The clips 24 are also attached to the surface pads 30. The clips 24 can be attached in the same solder reflow process that mounts the packages 12 and 18 to the substrate 16.

The covers 20 and 22 can be assembled to enclose the substrate 16 and the packages 12 and 18. The fasteners 40 are then installed to attach the assembly 10 to the circuit board 38. The installation of the fasteners 40 may also press the first cover 20 into the clips 24.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic cartridges comprising:

a substrate;

an integrated circuit package mounted to said substrate;

an electrically conductive cover that at least partially encloses said integrated circuit package; and, a C-shaped clip that is surface mounted to said substrate and electrically couples said cover to said substrate, said C-shaped clip has a base section that engages said cover and extends at an oblique angle from a mount section mounted to said substrate.

2. The cartridge as recited in claim 1, wherein said clip is deflected by said cover.

3. The cartridge as recited in claim 1, wherein said clip is constructed from a copper material.

4. The cartridge as recited in claim 1, wherein said clip is attached to a surface pad of said substrate.

5. The cartridge as recited in claim 1, wherein said cover is thermally coupled to said integrated circuit package.

6. The cartridge as recited in claim 1, wherein said cover is electrically coupled to said integrated circuit package.

7. The cartridge as recited in claim 1, further comprising a connector that is attached to said substrate.

8. An electronic cartridge, comprising:

a substrate which has a surface pad;

an integrated circuit package mounted to said substrate;

an electrically conductive cover that at least partially encloses said integrated circuit package; and, a C-shaped clip that is surface mounted to said substrate and is attached to said surface pad and pressed into said cover to electrically couple said cover to said substrate, said C-shared clip has a base section that engages said cover and extends at an oblique angle from a mount section mounted to said substrate.

9. The cartridge as recited in claim 8, wherein said clip is deflected by said cover.

10. The cartridge as recited in claim 8, wherein said clip is constructed from a copper material.

11. The cartridge as recited in claim 8, wherein said cover is thermally coupled to said integrated circuit package.

12. The cartridge as recited in claim 8, wherein said cover is electrically coupled to said integrated circuit package.

13. The cartridge as recited in claim 8, further comprising a connector that is attached to said substrate.

* * * * *

UNITED STATES PATENT AND TRADEMARK OFFICE
CERTIFICATE OF CORRECTION

PATENT NO. : 6,043,983  
DATED : March 28, 2000  
INVENTOR(S) : Taylor et al.

Page 1 of 1

It is certified that error appears in the above-identified patent and that said Letters Patent is hereby corrected as shown below:

Column 1,
Line 27, delete "Circuit" and insert -- circuit --.

Column 2,
Line 51, delete "6" and insert -- 16 --.

Column 3,
Line 12, delete "cartridges" and insert -- cartridge --.

Signed and Sealed this

Eighteenth Day of December, 2001

Attest:

*Attesting Officer*

JAMES E. ROGAN  
*Director of the United States Patent and Trademark Office*